United States Patent [19]
Maag et al.

[11] Patent Number: 5,748,754
[45] Date of Patent: May 5, 1998

[54] SOUND SYSTEM GAIN AND EQUALIZATION CIRCUIT

[75] Inventors: Clifford Maag, Provo; Lance Parker, Orem, both of Utah

[73] Assignee: Night Technologies International, Provo, Utah

[21] Appl. No.: 523,277

[22] Filed: Sep. 5, 1995

Related U.S. Application Data

[63] Continuation of Ser. No. 54,036, Apr. 28, 1993, abandoned.

[51] Int. Cl.$^6$ .................. H03G 5/00; H03G 3/00
[52] U.S. Cl. .................. 381/104; 381/103; 381/101; 381/98
[58] Field of Search .................. 381/104, 101, 381/103, 98, 100; 333/28 R, 28 T

[56] References Cited

U.S. PATENT DOCUMENTS

| | | |
|---|---|---|
| 4,773,094 | 9/1988 | Dolby . |
| 4,922,535 | 5/1990 | Dolby . |

*Primary Examiner*—Sinh Tran
*Attorney, Agent, or Firm*—Thorpe North & Western, L.L.P.

[57] ABSTRACT

A multi-band equalizer for receiving and processing an audio signal includes a plurality of operational amplifiers; each for processing a different frequency band of the audio signal to produce an output signal. Each operational amplifier includes an inverting input, a non-inverting input, a resistor means coupled to the non-inverting input for receiving the audio signal and supplying it to the non-inverting input, an output, a feedback circuit coupled between the output and the inverting input for determining the upper limits of the frequency band processed by that particular operational amplifier, and an input circuit coupled between the inverting input and ground potential for determining the lower limits of the frequency band processed by that operational amplifier. A summing circuit is coupled to the outputs of all of the operational amplifiers for combining the output signals thereof to produce a resultant signal. The summing circuit includes a plurality of variable resistors, each coupled to the output of a different operational amplifier for selectively varying the magnitude of the output signal from the respective operational amplifiers.

14 Claims, 1 Drawing Sheet

SOUND SYSTEM GAIN AND EQUALIZATION CIRCUIT

This application is a continuation of application Ser. No. 08/054,036, filed Apr. 28, 1993 now abandoned.

BACKGROUND OF THE INVENTION

This invention relates to an equalizer circuit and more particularly to a gain and equalization circuit for use in reducing distortion and other anomalies, and improving "clarity" in a variety of currently available sound systems.

Sound generation, recording and reproduction systems may take a variety of forms and perform a variety of functions, all relating, of course, to processing sound signals, with the common objective being to ultimately reproduce as accurately as possible the sound originally created or recorded or even "enhance" it. Such systems include, among others, public address systems and similar systems which utilize microphones and speakers, radio and television broadcast systems, radio and television receivers, tape recorders and disk recorders and players, home, auto and portable stereo systems, and recording studio systems. In all such systems, the sound is converted to electrical audio signals representing the sound, processed in some way, and then either reproduced, transmitted to other locations or recorded. At the various stages of generating the sound and processing the audio signals, there is a chance that either noise will be introduced to mask the true signals or the signals will be distorted (undesired change in signal waveform) in such a way that it is difficult to accurately reproduce the sound. Such noise and/or distortion may arise in the sound source itself, for example, instruments, voices, etc., in the room or studio acoustic configuration, in microphones which pick up the sound and convert it to electrical audio signals, in audio amplifiers and other audio signal processing components, in recording equipment and recording media, in speaker systems, and in audio signal transmitting equipment.

Ideally, all noise would be removed from (or not allowed to initially influence) the audio signal, and all processing of the audio signal would take place free from distortion, e.g., amplification would occur equally and uniformly over the entire audio signal frequency band (audio spectrum). However, achieving an essentially undistorted resultant audio signal has not been possible; rather in the course of reproducing an audio signal and otherwise processing such a signal, distortion of some form (phase distortion, frequency distortion, harmonic distortion, intermodulation distortion and the addition of noise) is inevitably introduced. Distortion, which is frequency dependent, means that the signal being processed is treated differently, e.g. amplified or phase shifted by different amounts, at the different frequencies contained in the signal. Such distortion prevents the accurate reproduction of the original sound transmitted, recorded, or produced.

In an attempt to reduce, to the extent possible, distortion and other undesirable deficiencies produced by room acoustics, microphones, loudspeakers, recorders, and other audio signal producing and processing components, what are called "equalizers" are provided. Equalizers effect or introduce a kind of controlled distortion of the frequency response which is ideally flat, for the purpose of offsetting or cancelling the distortion introduced during signal origination production and processing. Equalizers, in effect, alter the frequency response of an audio system in some desired manner. Initially equalizers were constructed of passive components, to provide attenuation or cuts at certain frequencies. Later designs were usually constructed with active components, typically vacuum tube circuits and operational amplifiers.

Among the more well known equalizers in use today is the so-called graphic equalizer which is incorporated into many professional, home and automobile sound systems. The graphic equalizer is generally constructed so that the console and controls present the appearance of a graphic display of the frequency response being developed by the equalizer, e.g., which bands of the audio signal are boosted and which are cut.

In another type of equalizer, known as the parametric equalizer, three parameters of equalization, including frequency selection, boost or cut, and bandwidth control, are all independently variable.

More elaborate studio equalizers are utilized in recording, broadcast and television studios and these consist basically of a parallel bank of band-pass filters in which the center frequencies of the filters are separated by some finite amount such as an octave or fraction thereof, typically one-third. The gain or attenuation of each filter is separately adjustable, the result of which is an overall frequency response which can be continuously set across the entire audio frequency range.

The inability of presently available equalizers to perform high quality "equalization" is indicated by a recent comment in *MIX*, December 1992, page 22 which reads:

"There has always been a serious problem with EQ I refer, of course, to our old friend Mr. Analog EQ It has never worked right and it never will.

While Analog EQ will change the response characteristic of a circuit, thereby increasing or decreasing the amount of passed energy in a given frequency band, the price is terribly high.

EQ made your tracks slur, soften up, come apart. It didn't take you long to learn that EQ was a tradeoff. You used as much as you could before the side effects did more damage than the EQ did good.

All this is due to phase shift. More EQ, more phase shift; that's how it's done! Until true zero-coefficient FIR digital EQ came along recently, equalizing without phase shift was just a dream."

Digital equalization is mentioned in the above-quoted comment as a means of achieving equalization without phase shift and this may or may not be true, but in any case, digital equalization is very costly, requiring analog-to-digital conversion circuitry, digital processing circuitry, and digital-to-analog conversion circuitry, all of which tend to modify or distort the signal in some way.

SUMMARY OF THE INVENTION

It is an object of the invention to provide a new and improved equalizer circuit for processing and performing equalization on audio signals.

It is a further object of the invention to provide such a circuit which is capable of selectively providing gain as well as equalization to an audio input signal.

It is another object of the invention to provide such a circuit for effectively reducing distortion, thereby improving clarity in currently available sound systems.

It is still another object of the invention to provide an analog equalizer which is simple in design, relatively inexpensive and yet effective in performing equalization without significant phase shift.

It is an additional object of the invention to provide such a circuit capable of accurately reproducing an audio square wave.

It is also an object of the invention to provide such a circuit which may be implemented as part of an audio preamplifier and in other environments requiring equalization.

It is a further object of the invention to provide a gain and equalization circuit having a substantially undistorted (flat) frequency response.

3

The above and other objects of the invention are realized in a specific illustrative embodiment of a gain and equalization circuit for processing received audio signal and including a plurality of operational amplifiers, each for processing and selectively amplifying a different band of frequencies of the audio signal to produce an output signal. Each operational amplifier includes an inverting input, a non-inverting input for receiving the audio signal, an output, a high pass filter network coupled between the inverting input and ground potential for determining the lower end of the frequency band processed by the operational amplifier, and a low pass filter network coupled between the output and the inverting input for determining the upper end of the frequency band processed by the operational amplifier. The gain and equalization circuit further includes a summing circuit coupled to the outputs of the operational amplifiers for selectively attenuating selected output signals and for combining the signals to produce a resultant combined signal covering the audio spectrum or desired portion thereof.

BRIEF DESCRIPTION OF THE DRAWINGS

The above and other objects, features and advantages of the invention will become apparent from a consideration of the following detailed description presented in connection with the accompanying drawings in which.

DETAILED DESCRIPTION

Figure 1:
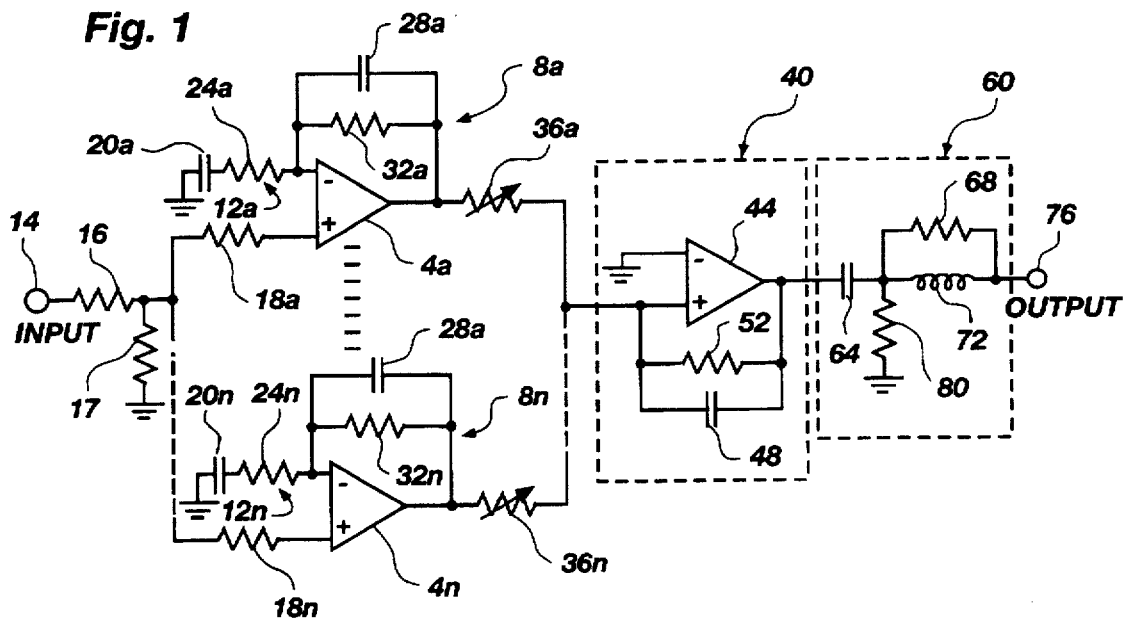
FIG. 1 shows a schematic of a gain and equalization circuit made in accordance with the principles of the present invention.

Referring to FIG. 1, there is shown an illustrative embodiment of an equalizer circuit made in accordance with the present invention to include a plurality of operational amplifiers 4, with associated feedback circuitry 8 and input circuitry 12, connected in parallel with one another. An audio signal input terminal 14 is coupled by way of a resistor divider 16 and 17, and resistors 18 to respective non-inverting inputs of the operational amplifiers 4. A plurality of input circuits 12 composed of series connections, of a capacitor 20 and a resistor 24, are coupled between ground potential and the inverting input of a respective operational amplifier 4. A plurality of feedback circuits each composed of a parallel connection of a capacitor 28 and resistor 32, couples the output of a respective operational amplifier 4 to the inverting input thereof, as shown.

The output of each operational amplifier 4 is coupled to a summing circuit 40 via a plurality of variable resistors 36, each coupled to the output of a different operational amplifier 4. The summing circuit 40 includes an operational amplifier 44 whose non-inverting input is coupled to ground and whose output is coupled by way of a parallel connection of a capacitor 48 and a resistor 52 to the inverting input of the amplifier. Each of the variable resistors 36 is likewise coupled to the inverting input of the operational amplifier 44.

The output of the summing circuit 40 is coupled to an output load isolation circuit 60 which is composed of a capacitor 64, a resistor 68 and inductor 72 coupled in parallel between the capacitor 64 and an output terminal 76, and a resistor 80 coupled from ground potential to the node between capacitor 64, resistor 68 and inductor 72.

Each of the operational amplifiers 4, with the associated input and feedback circuitry, acts as a filter to pass a different frequency band of the input audio signal. For example, if a

4 six band equalizer were desired, and therefore six operational amplifiers were provided, the frequency centers for the six bands could illustratively be, but not limited to, 10 Hz, 40 Hz, 160 Hz, 640 Hz, 2560 Hz, and 10240 Hz with the skirts varying ≈1½ dB at one octave from the respective center frequency, ≈6 dB at two octaves, ≈10 dB at three octaves, and ≈13½ dB at four octaves. The values of the feedback R/C network of capacitors 28 and resistors 32, and the input R/C network of capacitors 20 and resistors 24 are selected to provide the respective center frequencies of the bands in question. The feedback R/C network 8 of each operational amplifier forms a low pass filter to determine the high end roll-off or cut-off of the bands in question, while the input RIC network 12 of each operational amplifier forms a high pass filter to determine the low end roll-off of the band. With the configuration of FIG. 1, the same value capacitors can be used for capacitors 20, and same value capacitors can be used for capacitors 28, with different value resistors being required to provide the desired operating characteristics. For example, to obtain, the center frequencies identified above for a six band equalizer, suitable values for the capacitors and resistors could be:

resistor 24a=8 ohms
resistor 24b=32 ohms
resistor 24c=128 ohms
resistor 24d=512 ohms
resistor 24e=2048 ohms
resistor 24f=8192 ohms
resistor 32a=80 ohms
resistor 32b=320 ohms
resistor 32c=1280 ohms
resistor 32d=5120 ohms
resistor 32e=20,480 ohms
resistor 32f=81,920 ohms Exemplary values for the other circuit components are:

resistors 18=1.0k ohms
variable resistors 36=from 1.1k ohms to 101.1k ohms
resistor 52=11.1k ohms
capacitor 48=22 pf
capacitor 64=470 µf
resistor 80=10k ohms
resistor 68=47 ohms
inductor 72=100 µHenrys The operational amplifiers 4 of FIG. 1 might illustratively be, but is not limited to, model NE5532 AN amplifiers, made by Signetics.

With the circuit configuration described, phase distortion (phase shift) is reduced, with the center frequencies having substantially no phase shift when measured at the output of each band, and with only marginal phase shift occurring toward the high and low ends of the band. The resultant signal (from summing all band contributions) is a high clarity, substantially distortion free audio signal.

Figure 2:
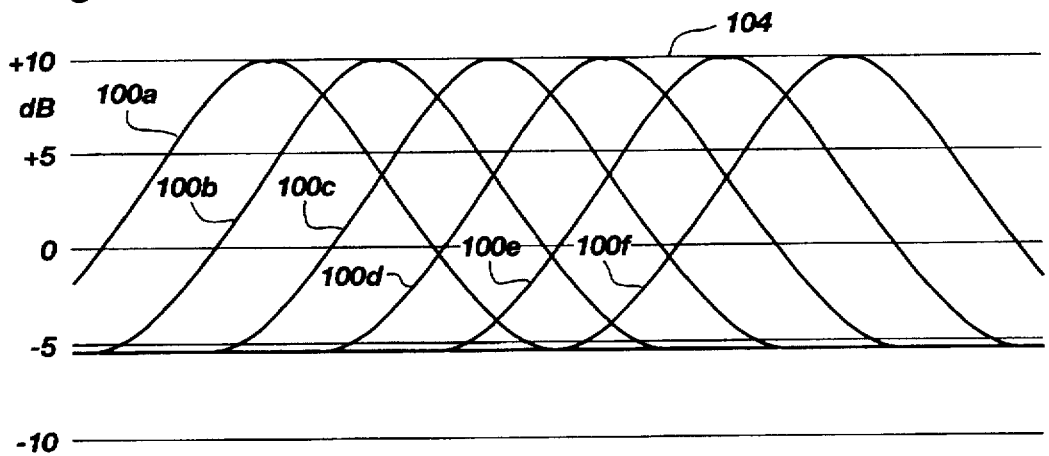
FIG. 2 shows individual waveforms produced by the operational amplifier circuits of FIG. 1, and a resultant waveform produced by combining the individual waveforms.

FIG. 2 shows output waveforms of several of the adjacent operational amplifiers of FIG. 1, together with the resulting waveform obtained from combining or summing the several waveforms, to indicate the flat frequency response achievable.

The resistor divider 16 is provided to attenuate or reduce the input level of the audio signal supplied to the input terminal 14 if the magnitude of such a signal is too great, such as when the audio signal being received is from an audio line amplifier. In the course of performing equalization by the operational amplifiers 4 and associated circuitry, the audio signal is again boosted to the desired level, but with the ability to tailor the frequency response.

If no attenuation of the audio input signal is necessary, then resistor divider 16 would be eliminated from the FIG.

1 circuit. This would be the case if, for example, the equalizer circuit of FIG. 1 were utilized as a combination equalizer/preamplifier in a microphone/speaker system. In such case, the circuitry of FIG. 1 would simply be substituted for the conventional pre-amplifier in the microphone/speaker system and the operational amplifiers 4 with associated circuitry, would provide both the desired amplification or "pre-amplification" and equalization of the signals received from the microphone.

Resistors 18 are provided to stabilize the operation and processing of the input signal by the operational amplifiers 4.

Variable resistors 36 are provided to either selectively allow gain in or to attenuate the respective band being supplied thereto. Advantageously, eleven position variable resistor switches are provided, each to provide five levels of gain and five levels of attenuation, with a central position being one in which no change in signal level occurs. In this manner, the contribution of each operational amplifier to the resulting "equalized" signal can be determined by manual adjustment of the variable resistors 36. The contributions from each operational amplifier are combined by the summing circuit 40 and then passed via the isolator circuit 60 to the output terminal 76.

It is to be understood that the above-described arrangements are only illustrative of the application of the principles of the present invention. Numerous modifications and alternative arrangements may be devised by those skilled in the art without departing from the spirit and scope of the present invention and the appended claims are intended to cover such modifications and arrangements.

What is claimed is:

1. A voltage gain and equalization circuit for processing a received audio signal, comprising:
    a plurality of operational amplifier means, each for processing and selectively amplifying a different frequency band of the audio signal to produce an output signal with generally no phase shift, and each including
        an inverting input,
        a non-inverting input for receiving the audio signal,
        an output,
        high pass filter means coupled between the inverting input and ground for determining the lower end of the frequency band processed by said each operational amplifier means,
        low pass filter means coupled between the output and the inverting input for determining the upper end of the frequency band processed by said each operational amplifier means, and
    summing means coupled to the outputs of each operational amplifier means for combining the output signals, each output signal passing a different frequency band of the audio signal thereof, to produce a resultant signal.

2. A voltage gain and equalization circuit as in claim 1 further including an isolation network for coupling the combining means to a load.

3. A voltage gain and equalization circuit as in claim 1 further including a plurality of variable resistance means, each coupled between the output of a respective operational amplifier means and the combining means, for selectively varying the magnitude of the output signal from said respective operational amplifier means.

4. A voltage gain and equalization circuit as in claim 1 wherein each operational amplifier means includes resistance means coupled to the non-inverting input of said each operational amplifier means.

5. A voltage gain and equalization circuit as in claim 4 wherein each high pass filter means comprises a series connection of a first capacitor and a first resistor coupled between the inverting input and ground, wherein the capacitance of the first capacitor and resistance of the first resistor are selected to roll off the low end of a frequency band different from those of the other operational amplifier means.

6. A voltage gain and equalization circuit as in claim 5 wherein each low pass filter means comprises a parallel connection of a second capacitor and a second resistor, wherein the capacitance of the second capacitor and resistance of the second resistor are selected to roll off the high end of a frequency band different from those of the other operational amplifier means.

7. A voltage gain and equalization circuit as in claim 6 wherein the separation between frequency bands processed by the plurality of operational amplifier means is about a factor of four.

8. A voltage gain and equalization circuit as in claim 6 wherein there are six operational amplifier means for processing respective ones of six different bands of the audio signal, where the center frequencies of the respective bands are 10 Hz, 40 Hz, 160 Hz, 640 Hz, 2560 Hz and 10240 Hz, with the skirts varying about 1½ dB at one octave from the respective center frequency, about 6 dB at two octaves, about 10 dB at three octaves and about 13½ dB at four octaves.

9. A voltage gain and equalization circuit as in claim 6 wherein the capacitance values of all the first capacitors are substantially the same, and wherein the capacitance values of all the second capacitors are substantially the same.

10. A voltage gain and equalization circuit as in claim 1 wherein the output of the plurality of operational amplifier means is coupled to the non-inverting input of the combining means.

11. A multiple-band equalizer for receiving and processing an audio signal comprising
    a plurality of operational amplifier means, each for processing a different frequency band of the audio signal to produce an output signal, and each including
        an inverting input,
        a non-inverting input,
        an output,
        feedback circuit means- coupled between the output and the inverting input for determining the upper limits of the frequency band processed by said each operational amplifier means, and
        input circuit means coupled between the inverting input and ground potential for determining the lower limits of the frequency band processed by said each operational amplifier means,
    summing circuit means coupled to the outputs of each operation amplifier means for combining the output signals thereof to produce a resultant signal.

12. An equalizer as in claim 11 further including a plurality of variable resistance means, each coupled to the output of a respective operational amplifier means for selectively varying the magnitude of the output signal from said respective operational amplifier means.

13. An equalizer as in claim 12 wherein each feedback circuit means includes a parallel connection of a capacitor and a resistor, and wherein each input circuit means includes a series connection of a capacitor and a resistor.

14. A voltage gain and equalization circuit as in claim 11 wherein the output of the plurality of operational amplifier means is coupled to the non-inverting input of the summing circuit means.

* * * * *